United States Patent
Maneira

(10) Patent No.: US 9,726,971 B2
(45) Date of Patent: *Aug. 8, 2017

(54) PRINTABLE LAMINATES FOR FLEXO PLATES, METHODS OF MAKING, AND METHODS OF USING

(71) Applicant: Chemence, Inc., Alpharetta, GA (US)

(72) Inventor: John P. Maneira, Alpharetta, GA (US)

(73) Assignee: Chemence, Inc., Alpharetta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/027,760

(22) Filed: Sep. 16, 2013

(65) Prior Publication Data

US 2014/0080042 A1    Mar. 20, 2014

Related U.S. Application Data

(63) Continuation-in-part of application No. 13/618,507, filed on Sep. 14, 2012, now Pat. No. 9,174,480, which is a continuation-in-part of application No. 12/895,561, filed on Sep. 30, 2010, now Pat. No. 9,023,591.

(51) Int. Cl.
G03F 7/20 (2006.01)
G03F 1/50 (2012.01)

(52) U.S. Cl.
CPC ............... *G03F 1/50* (2013.01); *G03F 7/20* (2013.01); *G03F 7/2018* (2013.01); *G03F 7/2032* (2013.01)

(58) Field of Classification Search
CPC ......................................... G03F 7/20
See application file for complete search history.

(56) References Cited

U.S. PATENT DOCUMENTS

2008/0050548 A1*  2/2008  Abrams ............... 428/41.8

* cited by examiner

*Primary Examiner* — Chanceity Robinson
(74) *Attorney, Agent, or Firm* — Jonathan R. Smith; Jonathan Rigdon Smith, J.D., PC

(57) ABSTRACT

Negatives and laminates containing negatives for exposing liquid photopolymers in UV flexographic plate making are created by printing opaque images directly onto the protective or release cover films used in plate making processes. Combining negatives and cover films in this way eliminates two layers and two interfaces in the exposure process, reducing cost and improving quality.

21 Claims, 10 Drawing Sheets

PRINTABLE LAMINATES FOR FLEXO PLATES, METHODS OF MAKING, AND METHODS OF USING

CROSS-REFERENCES TO RELATED APPLICATIONS

This application is a Continuation-in-Part of U.S. patent application Ser. No. 13/618,507 filed Sep. 14, 2012, which is in turn a Continuation-in-Part of U.S. patent application Ser. No. 12/895,561, and claims priority thereto. Related patent applications are U.S. Application Publication No. 2012/0082932 and U.S. patent application Ser. No. 13/902, 301.

STATEMENT REGARDING FEDERALLY SPONSORED RESEARCH OR DEVELOPMENT

Not applicable.

NAMES OF THE PARTIES TO A JOINT RESEARCH AGREEMENT

Not applicable.

REFERENCE TO A BIOLOGICAL SEQUENCE LISTING

Not applicable.

BACKGROUND OF INVENTION

Field of the Invention

This invention is in the field of printing, more specifically in the field of making flexographic printing plates from liquid photopolymers.

Description of the Related Art

Flexographic printing is a printing process which uses a flexible rubber or photopolymer relief plate, prepared with raised areas called relief areas, corresponding to an image to be printed, and surrounded by lower areas called floor areas. The plate is typically secured to a revolving drum which is contacted by an anilox roll system to coat the relief areas with ink and subsequently presses the inked areas against a moving sheet of, e.g., paper or corrugated box board. The flexible printing plates may alternatively be applied to a plate mount, e.g., hand stamps, or, potentially, non-planar surfaces other than drums.

Images for flexographic printing are typically created by using a negative of an image to mask non-image areas on a layer of photosensitive polymer ("photopolymer"). Photopolymers cure by cross-linking under exposure to ultraviolet (UV) light. The plates may be imaged digitally (what is known as computer-to-plate or CTP) or by the analog process of exposing and developing traditional film. Such films (as supplied by Kodak, Fuji, etc.) are processed into negatives via an image setter.

Another method of making negatives uses an inkjet printer to print a UV-blocking ink onto a clear plastic, e.g., polyester, material. The surface of the plastic material must be inkjet-receptive or made to be inkjet-receptive, that is, able to create an acceptably stable and detailed image, i.e., one that adheres to the plastic and dries quickly without migrating. The plastic material may be made inkjet-receptive by coating it with an inkjet-receptive coating, e.g., a micro-porous coating or a coating of inkjet-receptive polymer, or the material may be treated in some other manner such as acid etching, etc. to produce a surface that allows the ink to adhere to the film and dry quickly without migrating. The uncoated plastic material may alternatively be printed with an inkjet ink directly so long as the ink and the plastic are mutually compatible. The printed image must also have an opacity of at least about 3.0 to prevent UV curing of unexposed photopolymers during the amounts of time required to cure the exposed photopolymers.

Liquid photopolymer flexographic plates are made in an exposure unit having a horizontal bottom glass with a source of UV light below it (lower light), and a lid having a flat top glass with a source of UV light above it (upper light). A traditional flexographic plate is made in the following manner: a negative of the desired image, as prepared by one of the above methods, is placed on the bottom glass, the negative is protected by a thin optically clear film known as cover film. Liquid photopolymer is then cast over the cover film to a predetermined thickness. A substrate for supporting the photopolymer is then laminated over the liquid photopolymer. Thus a sandwich of negative, cover film, liquid polymer and substrate is created. Typically, the substrate consists of a backing sheet of photo-transmissive polymer such as polyester, with a "tie-coat" applied to one side to bond the cured photopolymer to the backing sheet. The substrate is placed in such a manner that the tie-coat is in direct contact with the liquid photopolymer. Liquid photopolymers (such as supplied by Chemence and MacDermid) are cast over the image negative (protected by a cover film) and bond to the polyester backing sheet by the tie-coat.

Precise reproduction of the negative image detail onto the photopolymer requires that the negative be placed as close to the photopolymer layer as possible. In the liquid plate-making process the bottom glass surface is grooved in such a way that, when a vacuum is applied to the grooves, air is removed between the cover film and the relief image negative.

Next, the UV light source in the lid (the upper light) is turned on for a prescribed amount of time to cause the photopolymer adjacent to the substrate to cross-link uniformly over the entire plate, forming the floor. The areas to be imaged are then exposed by the lower UV light (from below the bottom glass) that shines through the clear areas of the relief image negative, which causes the photosensitive polymer to cross-link, forming images that bond to the polymer floor. The (liquid) photopolymer that is not exposed to UV light remains in a liquid state to be later reclaimed and reused. Unexposed sheet photopolymer, by contrast, is not reusable and becomes waste.

The plate-making arrangement is then taken out of the exposure unit and the photopolymer material that has not been cured by UV light is removed from it, leaving the areas exposed to light as relief areas. Un-polymerized liquid photopolymers can be reclaimed by draining and wiping the un-polymerized liquid off the substrate into a suitable container. Photopolymer reclaim can be accomplished manually by squeegee, by a reclaim board with rollers or by an air knife and augmented or enhanced by using heat.

The amount of photopolymer necessary to create a stable floor underneath the relief image portions is reduced in the I-Plate (in-position plate, island plate) process, which adds another step to the above process. Instead of making a floor that extends over the entire plate, a second photographic negative is placed on top of the photopolymer layer. This negative, called a masking film, is a negative that outlines the image areas on the negative with a border of one-quarter to one half inch, more or less. It is predominately black. The relief image negative and masking film are aligned so that each image area of the relief image negative is approximately in the middle of each clear area of the masking film. This prevents a floor area from being created where the masking film is black.

The most commonly-made flexographic printing plates and hand stamps are now manufactured as island plates in the following manner: the first exposure to upper UV light from the lid is through the masking negative, causing islands of cured polymer to be formed beginning in the photosensitive layer adjacent to the substrate. The timing and intensity of the exposure are limited to prevent the polymerization extending all the way through the photopolymer layer from the substrate to the free surface of the layer. The second lower UV exposure, from below the relief image negative, causes the cured detailed relief image to form on top of the islands.

Because of the placement of the second negative above the photopolymer substrate layer, the application of vacuum to remove air from between the negative and the photopolymer substrate layer is less effective than when just the substrate is used. Thus, in this prior art method for producing an I-plate, the increase in recovery of photopolymer comes at the expense of some loss of precision of the relief image. Alternatively the mask negative can be placed above the exposure glass but in this fashion distorts the resulting island formation. The "spread" in the light transmission through the thick upper glass yields an island that is larger than the negative with a broader shoulder. It is also more difficult to register the second negative to the first negative in setting up the process. This problem is solved by the substrate and method for making island plates using liquid photopolymers described in U.S. Application Publication No. 2012/0082932, which is incorporated by reference into this application in its entirety. It employs an inkjet-receptive coating applied to the surface of the backing sheet opposite to the tie-coat. This laminate of tie-coat, backing sheet, and inkjet-receptive coating, known as I-Strate™ and marketed by Chemence, Inc. of Alpharetta, Ga., U.S.A., is a substrate that enables a masking image to be applied opposite to the tie-coat using an inkjet printer. In accordance with the embodiments of the parent application, one single sheet performs the dual role of plastic backing and I-plate masking film.

Parent U.S. application Ser. No. 13/618,507 describes additional features called "I-Strate Plus™." It differs from the above-described I-Strate™ laminate and method in that the inkjet-receptive coating is not applied directly to the backing; rather adhesive is pre-applied to the backing and covered with a clear, flexible cover film/release liner, as in the Kwikmount™ system, and the inkjet-receptive coating is applied to the cover film/release liner, transforming the cover film/release liner into a surface upon which a negative can be printed. In another embodiment, the cover film/release liner itself is inkjet-receptive, and the negative is printed directly on the liner. This masking negative is removed along with the flexible cover film/release liner immediately prior to mounting the plate. Like Kwikmount™, I-Strate Plus™ can be mounted on a printing plate or roll without the step of applying adhesive to the flexographic plate manually.

An important point to be made about the related art described above is that the inkjet inks used have necessarily been water-based because solvent-based (non-aqueous) inks have heretofore not been sufficiently optically dense. As a result, the above-described print surfaces employ a microporous coating to produce a surface that allows the ink to adhere to the film and dry quickly without migrating. U.S. application Ser. No. 13/902,301, incorporated by reference into this application in its entirety, describes and claims solvent-based inkjet inks and combinations of these with films they are printed on that are result in images that are sufficiently optically dense to create negatives that can be used to expose photopolymers in flexographic plate making.

BRIEF DESCRIPTION OF THE INVENTION

Objects of the Invention

The principal object of this invention is to enable flexographic plate-making negatives to be printed directly on the protective cover film, the adhesive release liner, and/or the polyester backing sheet used in the plate making process. This means, in other words, printing directly on the cover film normally used to protect the relief image negative under a liquid photopolymer layer, and on the release liner protecting the adhesive on the flexographic plate backing sheet. Doing this eliminates two separate negative layers and their interfaces by combining the relief image negative with the lower protective cover film and the island plate negative typically used above the backing sheet with the adhesive release liner. The scope of the invention includes using water-based inks, or preferably using solvent-based inks, printed by inkjet or other printing means, onto untreated, treated, or coated cover films/release liners.

SUMMARY OF THE INVENTION

The present invention includes negatives, and laminates containing negatives, for exposing liquid photopolymers, in which the negatives are created by printing opaque images, preferably solvent-based inkjet images, onto protective cover films, release liners, and/or backing sheets used in flexographic plate making processes. Combining negatives and cover films/release liners in this way eliminates two layers and two interfaces in the exposure process, reducing cost and improving quality.

These and other benefits will become more clearly illustrated in the following detailed description and drawings.

DETAILED DESCRIPTION OF THE INVENTION

Figure 1:
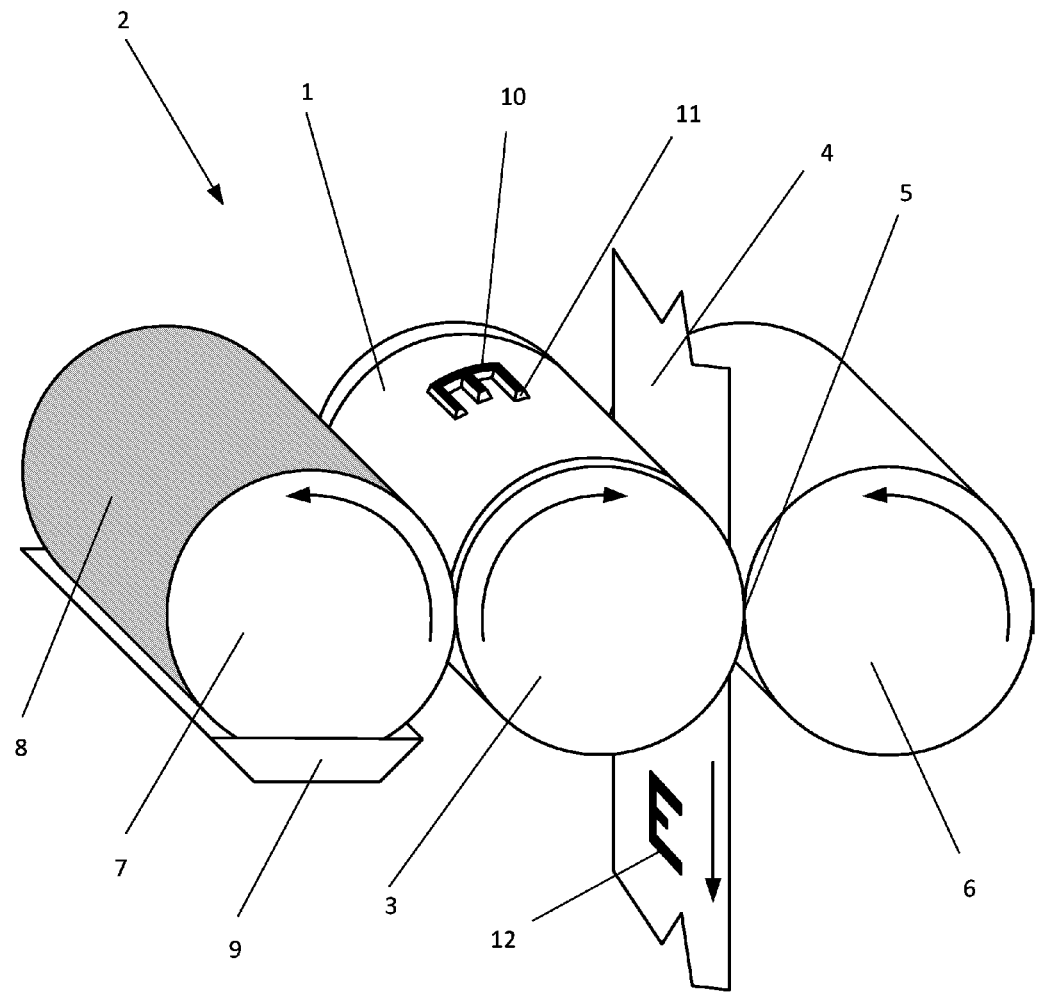
FIG. 1 is a perspective view of a flexographic plate in use on a printing machine.

Referring now to the drawings, in which like elements in the several figures are represented by like reference characters, FIG. 1 is a simplified, not-to-scale representation in perspective view of a flexographic plate 1 in use on a printing machine 2. The flexographic plate 1 (so called because it is made from flexible material, flexed into a cylindrical shape, and comprises flexible typefaces or relief faces) is fastened to cylindrical print roll 3. A sheet of printable material, e.g., paper 4, is printed by being fed through a nip 5 between the print roll 3 and a pressure roll 6. Inking roll 7 (typically an anilox roll) picks up a liquid film of ink 8 from, e.g., an ink tray 9, transferring it to the top surface 10 of a relief image 11 integral to the flexographic plate 1. The top surface 10 prints an ink image 12 on the paper.

Figure 2:
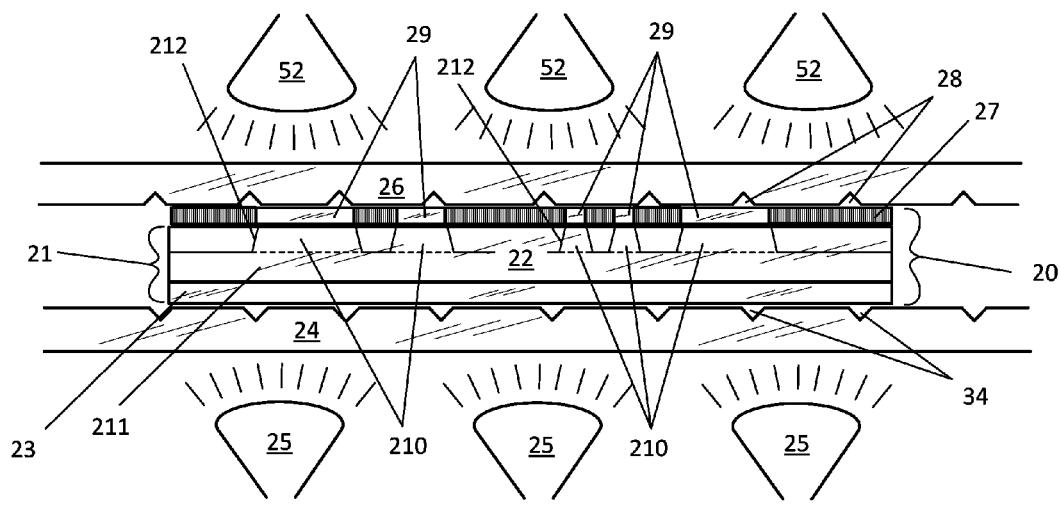
FIG. 2 is a cross-sectional illustration of a prior art method of using a sheet polymer to make a flexographic plate.

In making sheet plates the imaging negative is placed above the plate, as shown in FIG. 2. The sheet process also employs a vacuum cover (not shown) to assure intimate contact of the film to the sheet photopolymer.

FIG. 2 is a cross-sectional illustration of a prior art method of using a sheet photopolymer 21 in an arrangement of other layers 20 to make a flexographic plate. The sheet photopolymer is made up of a flexible layer of uncured photopolymer 22 affixed to a thin, flexible layer of photo-transmissive polyester, PVC, or other plastic backing 23. In this and the following figures, only the parts of the plate-making system (exposure unit) that relate to the present invention are shown. The principal parts of the plate-making system used to make a flexographic plate from the sheet photopolymer are a flat, horizontal bottom glass 24, lower UV lights 25 mounted below the bottom glass in the base of the exposure unit, and, mounted in a lid (not shown), a flat top glass 26, and upper UV lights 52. The lid (not shown) is hinged to the base of the exposure unit so that the top glass may be lowered into a horizontal position, as shown, on top of the plate-making arrangement 20 after the plate-making arrangement 20 is placed on the bottom glass 24.

After a photographic negative of the relief areas to be printed is made either by a film, digital, or inkjet method described above, the steps involved in making a traditional flexographic plate from a sheet photopolymer are:

a. Place a sheet of unexposed sheet photopolymer 21 on the bottom glass 24 with the backing 23 against the bottom glass 24;

b. Place the image negative 27 (the black areas of the negative are represented here by vertical hatching, even though the thickness of the image material is minuscule) on top of the sheet photopolymer 21;

c. cover the entire plate-making arrangement 20 with a vacuum sheet (not shown);

d. Lower the top glass 26 over the plate-making arrangement 20;

e. Turn on a vacuum source (not shown) connected to the lower vacuum grooves 34 to remove air from between the various layers;

f. Turn on the lower UV lights 25 for a prescribed amount of time to shine through the lower glass 26, causing a uniform floor layer 211 to form in the photopolymer layer 22 above the backing 23;

g. Turn on the upper UV lights 52 to shine through the clear areas 29 in the negative 27, causing vertical regions 210 the sheet photopolymer below the clear areas 29 to polymerize and bond to the floor layer 211 (at the horizontal dashed lines); and h. remove the exposed sheet photopolymer from the unit for further processing to create the relief image, namely, by mechanically removing the un-polymerized photopolymer from above the floor layer 211 by scrubbing the sheet photopolymer with solvent.

Note in this and the following figures that the lateral boundaries 212 between the exposed, polymerized photopolymer and the unexposed, un-polymerized photopolymer are inclined from the vertical by about 30 degrees, making the bases of the vertical regions 210 wider farther away from the light source than they are close to the light source. These "shoulders" form on the sides of the vertical regions 210 because the light spreads out as it passes through the photopolymer. This effect can be controlled by the shape of the light source and the thickness of the photopolymer layer, and, properly controlled, is beneficial in that it increases the dimensional stability of the vertical regions during the printing process.

As in any process where an image is formed by blocking light by interposing a mask directly over a photosensitive surface, the closer the mask is to the surface, the sharper the image formed. Application of vacuum to the grooves 28 removes air from among the imaging-related layers in the plate-making arrangement 20, thus pulling the image mask closer to the photopolymer layer. The closeness of the mask (in this case the single negative 27) to the sheet photopolymer layer 22 depends on how well the vacuum applied at the grooves 28 reaches the boundary between those two layers. The vacuum is maximally effective here because this boundary is the only one to be evacuated other than the ones that necessarily exist at the glass surfaces. In the following arrangements, more air-containing boundaries are added, thereby decreasing the effectiveness of the vacuum on any one boundary and potentially decreasing the sharpness of the image boundaries. In the sheet process the intimate contact between the photopolymer surface and the negative is achieved by use of the vacuum cover sheet, not vacuum applied to the upper vacuum grooves 28.

Figure 3:
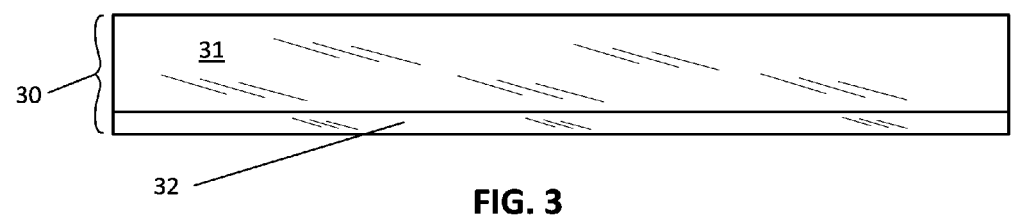
FIG. 3 is a cross-sectional view of a prior art polyester substrate for use with liquid photopolymer.

FIG. 3 is a cross-sectional view of a prior art polyester substrate 30 for use with liquid photopolymer (in contrast to the above-described sheet photopolymer, which utilizes a backing sheet pre-coated with an un-polymerized photopolymer that is basically in a solid form). The substrate 30 consists of a photo-transmissive polyester sheet 31 that has a specialized coating called a "tie-coat" 32 applied to one side. The tie-coat is necessary because cured liquid photopolymer cannot adequately bond to the backing sheet without it.

Figure 4:
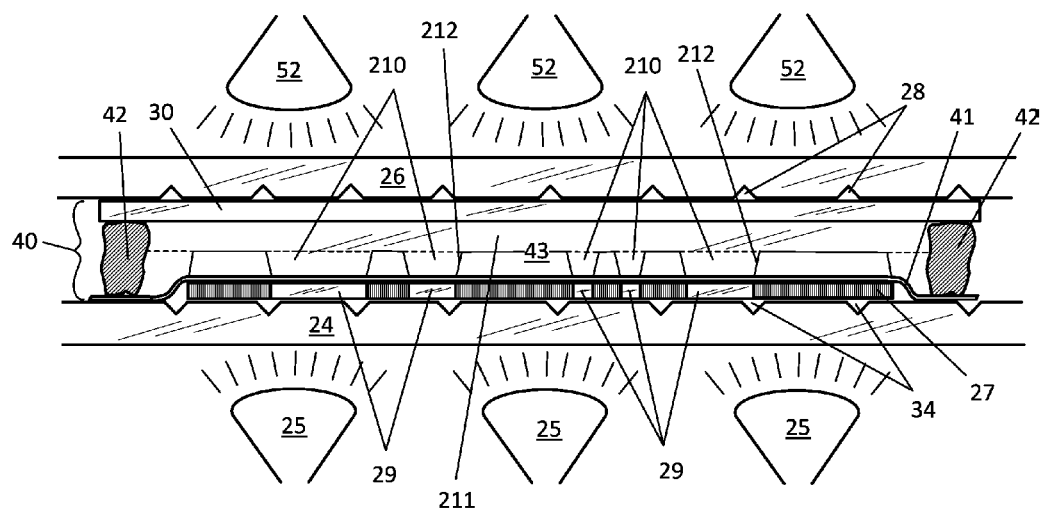
FIG. 4 is a cross-sectional illustration of a prior art method of using a liquid photopolymer polymer to make a flexographic plate.

FIG. 4 is a cross-sectional illustration of a prior art method of using a liquid photopolymer to make a flexographic plate. An arrangement of plate-making layers 40 is assembled to make a traditional flexographic plate using a liquid photopolymer where a prior art substrate 30 is laminated to the cast liquid. The steps to accomplish this are:

a. Place the image negative 27 on the bottom glass 24;

b. Cover (protect) the negative 27 with a clear cover film 41;

c. Turn on a vacuum source (not shown) connected to the lower vacuum grooves 34 to remove air from between the bottom glass 24, the image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative; (Dams are optional and not used in all instances. The liquid photopolymer is very viscous and does not readily flow after lamination in the process.)

e. Pour or cast liquid photopolymer 43 over the cover film 41 (within the dams 42 if applicable);

f. Apply a polyester substrate 30 over the liquid photopolymer 43 with the tie-coat side down (tie-coat not visible in this view);

g. Lower the top glass 26 over the entire plate-making arrangement 40;

h. Turn on a vacuum source (not shown) connected to the upper vacuum grooves 28 to remove air from between the substrate 30 and the upper glass 26;

i. Turn on the upper UV lights 52 for a prescribed amount of time to shine through the upper glass 26, causing a uniform floor layer 211 to form in the photopolymer layer 43 below the substrate 30;

j. Close the shutter (not shown) to prevent light reflection from the upper glass during the image exposure step;

k. Turn on the lower UV lights 25 to shine through the clear areas 29 in the negative 27, causing vertical regions 210 in the liquid photopolymer 43 above the clear areas 29 to polymerize; and l. Remove the plate-making arrangement 40 from the unit for further processing to create the relief image, namely, by turning the plate-making arrangement over, removing the cover film 41 and dams 42, and draining/collecting the un-polymerized liquid photopolymer for recycle and reuse.

Figure 5:
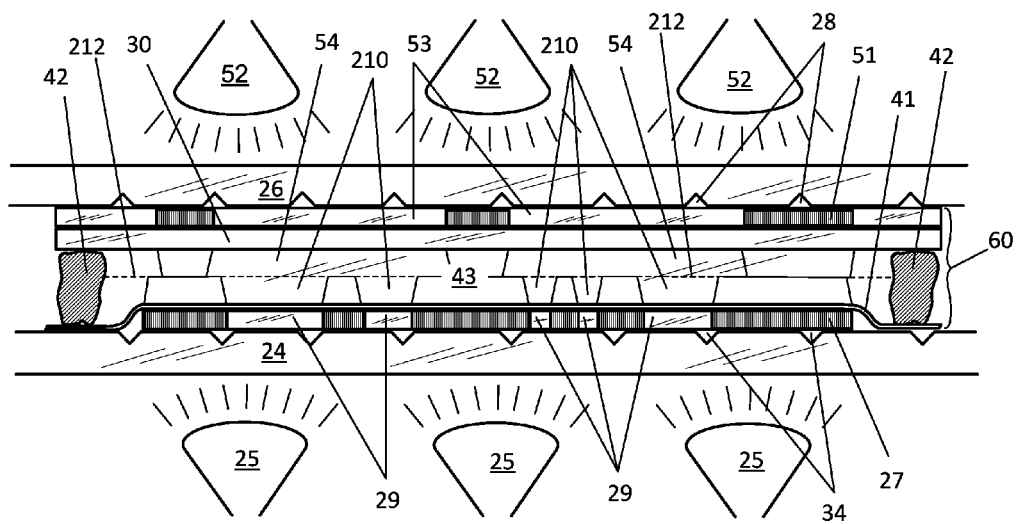
FIG. 5 is a cross-sectional illustration of a prior art method of using a liquid photopolymer to make a flexographic I-plate.

FIG. 5 is a cross-sectional illustration of a prior art method of using a liquid photopolymer to make a flexographic I-plate. A prior art plate-making arrangement 60 is assembled to make a flexographic I-plate using a liquid photopolymer where the polyester substrate 30 is laminated to the cast liquid. The steps involved are:

a. Place the relief image negative 27 on the bottom glass 24;

b. Cover (protect) the negative with a clear cover film 41;

c. Turn on a vacuum source (not shown) connected to the lower vacuum grooves 34 to remove air from between the bottom glass 24, the image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative;

e. Pour or cast liquid photopolymer 43 over the cover film 41 (within the dams 42 if applicable);

f. Apply a polyester substrate 30 over the liquid photopolymer 43 with the tie-coat side down (tie-coat not visible in this view);

g. Place the masking film 51 on top of the polyester substrate 30 and register it so that the clear areas 53 on the masking film 51 properly surround the clear areas 29 on the image negative 27 below;

h. Lower the top glass 26 over the entire plate-making arrangement 60;

i. Turn on a vacuum source (not shown) connected to the vacuum grooves 28 to remove air from between the upper glass 26, the masking film 51, and the substrate 30;

j. Turn on the upper UV lights 52 to shine through the clear areas 53 in the masking negative 51 for a limited time, causing vertical regions 54 in the liquid photopolymer below the clear areas 53, adjacent to the polyester substrate 30, to polymerize a portion of the liquid photopolymer layer 43 to form island floor areas;

k. Close the shutter (not shown) to prevent light reflection from the upper glass during the image exposure step;

l. Turn on the lower UV lights 25 to shine through the clear areas 29 in the relief image negative 27, causing vertical regions 210 in the un-polymerized liquid photopolymer above the clear areas 29 (and below the vertical regions 54) to polymerize an additional amount of the liquid photopolymer layer 43 to form the relief image; and m. Remove the plate-making arrangement 60 from the unit for further processing to uncover the relief image, namely, by turning the plate-making arrangement over, removing the cover film 41 and dams 42, and draining/collecting the un-polymerized liquid photopolymer for recycle and reuse.

Note that this plate-making arrangement 60 adds an image-quality-reducing boundary between the masking film 51 and the polyester substrate 30 which must also be evacuated by the vacuum grooves 28. Regardless of how well the vacuum works, it is not perfect, and the masking film 51 is displaced away from the liquid photopolymer layer 43 by the thickness of the polyester substrate 30. (The boundaries between the liquid photopolymer layer 43 and the polyester substrate 30 above it and the cover film 41 below it are substantially free of air because the liquid flows against them.)

A flexographic I-plate could be made using a sheet photopolymer, but it is pointless compared to the prior art process using liquid photopolymer just discussed. There is no relative benefit, and in the process of creating islands on the sheet, the amount of polymer waste is increased, the use of solvent to process the plate is increased, and the plate processing time would be lengthened. The remainder of this description will therefore deal with liquid photopolymer.

Figure 6:
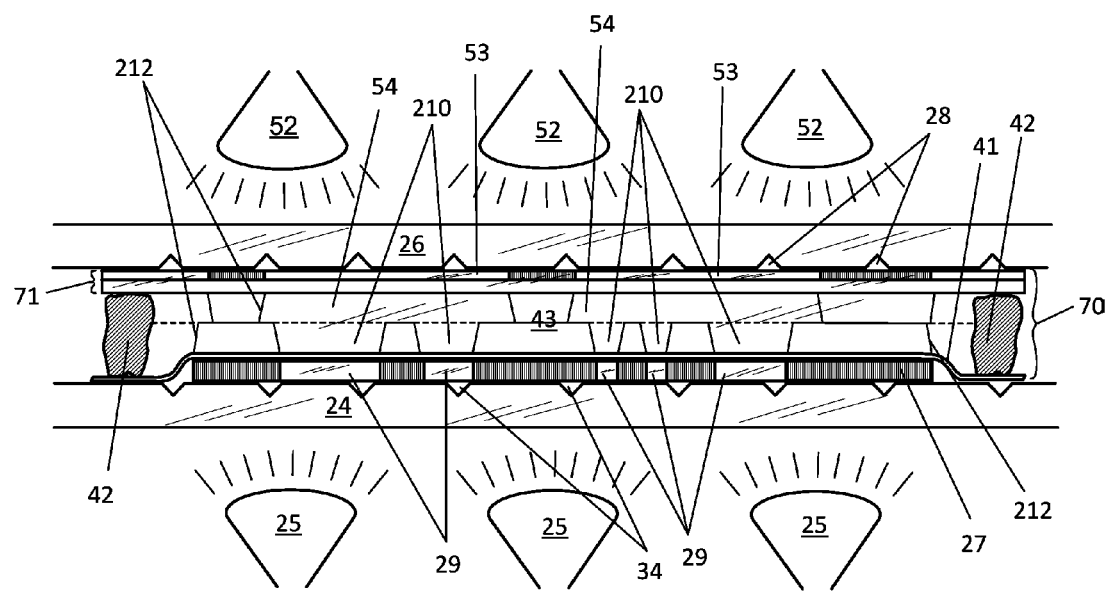
FIG. 6 is a cross-sectional illustration of the method of using an I-Strate™ substrate for making a flexographic plate using a liquid photopolymer.

FIG. 6 is a cross-sectional illustration of the method of using an I-Strate™ or I-Strate Plus™ substrate 71 for making a flexographic plate using a liquid photopolymer. A plate-making arrangement 70 is assembled for making a flexographic plate using I-Strate™ or I-Strate Plus™. The steps involved are:

a. Place the relief image negative 27 on the bottom glass 24;

b. Cover (protect) the negative with a clear cover film 41;

c. Turn on a vacuum source (not shown) connected to the lower vacuum grooves 34 to remove air from between the bottom glass 24, the relief image negative 27, and the clear cover film 41;

d. Depending on the viscosity of the liquid photopolymer, nonporous damming material 42 may have to be placed around all sides of the negative 27 to control flow of liquid photopolymer over the negative by creating a shallow basin on the negative;

e. Pour or cast liquid photopolymer 43 over the cover film 41 (within the dams 42 if applicable);

f. Print the desired island image on the inkjet-receptive side of an I-Strate™ substrate 71.

g. Apply the I-Strate™ substrate 71 over the liquid photopolymer 43 with the tie-coat 32 side down (see FIG. 7) and register it so that the clear areas 53 on the I-Strate™ substrate 71 properly surround the clear areas 29 on the image negative 27 below;

h. Lower the top glass 26 over the entire plate-making arrangement 70;

i. Turn on a vacuum source (not shown) connected to the vacuum grooves 28 to remove air from between the upper glass 26 and the I-Strate™ substrate 71;

j. Turn on the upper UV lights 52 to shine through the clear areas 53 in the I-Strate™ substrate 71 for a limited time, causing vertical regions 54 in the liquid photopolymer below the clear areas 53, adjacent to the I-Strate™ substrate 71, to polymerize a portion of the liquid photopolymer layer 43 to form island floor areas;

k. Close the shutter (not shown) to prevent light reflection from the upper glass during the image exposure step;

l. Turn on the lower UV lights 25 to shine through the clear areas 29 in the relief image negative 27, causing vertical regions 210 in the un-polymerized liquid photopolymer above the clear areas 29 (and below the vertical regions 54) to polymerize an additional amount of the liquid photopolymer layer 43 to form the relief image; and m. Remove the plate-making arrangement 70 from the unit for further processing to uncover the relief image, namely, by turning the plate-making arrangement 70 over, removing the cover film 41 and dams 42, and draining/collecting the un-polymerized liquid photopolymer off for recycle and reuse.

Note here that the use of the I-Strate™ substrate 71 eliminates the second air-containing boundary described in FIG. 5 and places the masking image in the substrate closer to the liquid photopolymer layer 43 by making it part of the substrate.

Also noteworthy here is that the use of an I-Strate™ substrate makes it easier to register the island image negative precisely against the relief image negative than is the case with a conventional, separate island image negative. This is because the I-Strate™ substrate 71 sticks to the surface of the liquid photopolymer layer rather than floating around lightly on the dry surface of a conventional substrate (note FIG. 5 step (g) above and see 51 and 30 in FIG. 5). This reduces the incidence of mis-register.

The minor steps listed above for confining the liquid and applying vacuum are conventional and may either be optional or may vary according to the equipment used for exposing the photopolymer. Thus, the necessary steps for preparing an I-plate from liquid photopolymer using a blank sheet of I-Strate™ substrate 71, starting with a digital representation of an island image and a suitable inkjet printer, are as follows:

a. Print the digital representation of the island image on the inkjet-receptive side 83 of the I-Strate™ substrate 71 using the inkjet printer;

b. Place the lower surface of the liquid photopolymer layer 43 adjacent to the relief image negative film 27 (by pouring or casting the liquid photopolymer over the protected relief image negative film as is commonly practiced);

c. Place the tie-coat 32 of the I-Strate™ substrate 71 in contact with the upper surface of the liquid photopolymer layer 43 (registering the island image properly with respect to the relief image negative);

d. Shine polymerizing light through the I-Strate™ substrate 71 for an amount of time suitable to form polymerized island floor areas 54 of a desired thickness in the liquid photopolymer in contact with the tie-coat 32; and e. Shine polymerizing light through the relief image negative 27 for an amount of time suitable to form a polymerized relief image 210 in the liquid photopolymer between the polymerized island floor areas 54 and the relief image negative 27.

Steps b. through e. apply if the I-Strate™ substrate has already been printed.

Figure 7:
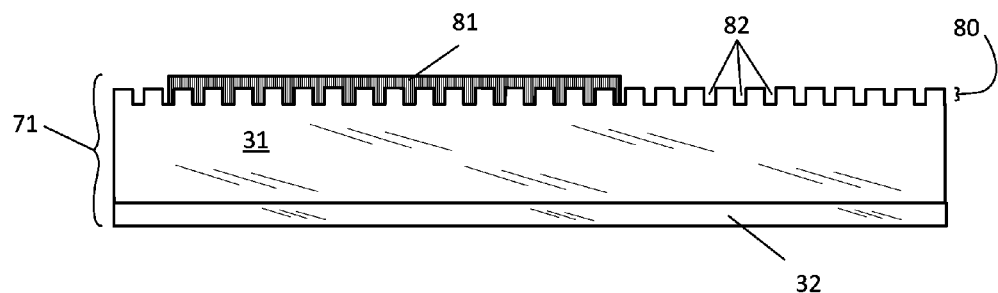
FIG. 7 is a cross-sectional view of the I-Strate™ substrate for use with liquid photopolymer.

FIG. 7 is a cross-sectional view of the I-Strate™ substrate 71 for use with liquid photopolymer. It consists of a photo-transmissive plastic backing sheet 31 that has a tie-coat 32 applied to one side, to bond with polymerized liquid photopolymer, and an inkjet-receptive surface 80 on the other side. The inkjet-receptive surface 80 (represented here by vertical notches 82) enables inkjet ink 81 to be printed on the I-Strate™ 71 and adhere to the backing sheet 32, creating a masking negative. The inkjet-receptive surface 80 is preferably created by application of a micro-porous coating or inkjet-receptive polymer coating, but may also be created by mechanical means such as abrasion, stamping or molding, by physical means such as laser or thermal treatment, or by chemical means such as acid etching or exposure to solvent. The surface 80 itself may be inkjet-receptive depending on the chemical composition of the film surface and the composition of the ink. Thus, certain inkjet inks can be applied directly to compatible plastic sheets that are also compatible with tie-coats.

Figure 8:
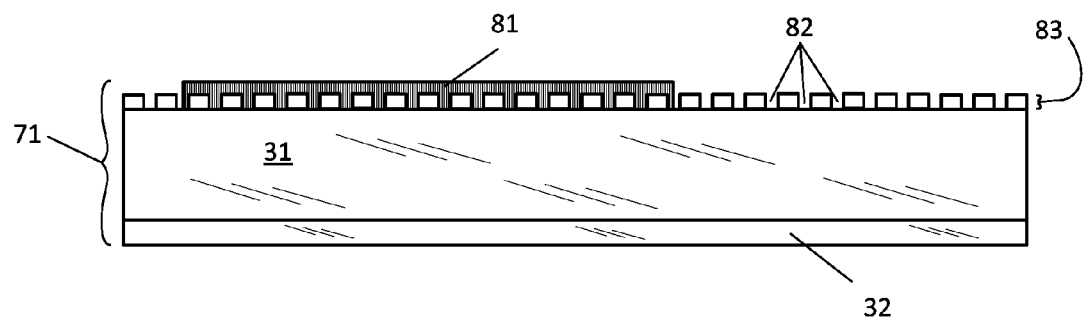
FIG. 8 is a cross-sectional view of the I-Strate™ substrate for use with liquid photopolymer.

FIG. 8 is a cross-sectional view of the preferred embodiment of the I-Strate™ substrate 71 for use with liquid photopolymer, consisting of a photo-transmissive polyester backing sheet 31 that has a tie-coat 32 applied to one side, to bond with polymerized liquid photopolymer, and an inkjet-receptive polymer-based coating 83 applied to the other side. Like the micro-porous surface 80 in FIG. 7, the polymer-based coating 83 also enables inkjet ink 81 to be printed on the I-Strate™ 71 and adhere to the backing sheet 32, creating a masking negative. At the present time, the preferred inkjet-receptive coating is a water-based polymer coating formulated to hold water-based inkjet inks. (Such inks currently produce smaller ink droplets than non-aqueous inks and are thus capable of producing finer images.) Thus, the preferred embodiment of I-Strate™ is a flexible sheet of clear polyester 31 with a tie-coat 32, compatible with the liquid photopolymer, applied to one side, and a coating 83, compatible with water-based inkjet ink, applied to the other side.

Figure 9:
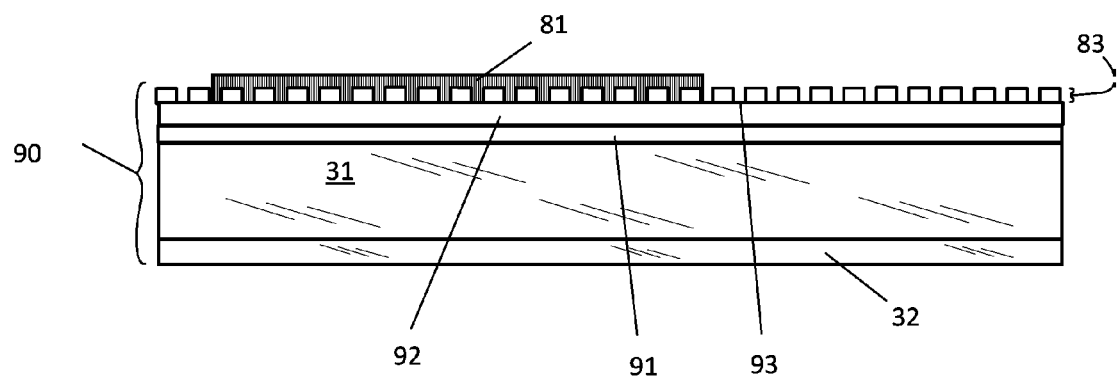
FIG. 9 is a cross-sectional view of the I-Strate Plus™ substrate for use with liquid photopolymer.

FIG. 9 is a cross-sectional view of the preferred embodiment of the I-Strate Plus™ substrate 90, for use with liquid photopolymer, also illustrating the preferred method of making it in accordance with prior invention described in U.S. application Ser. No. 13/618,507. As in I-Strate™, it consists of a photo-transmissive backing sheet 31 with a tie-coat 32 applied to one side. In this embodiment, however, a pressure sensitive adhesive coating 91 has been applied to the other side. The pressure sensitive adhesive coating 91 is covered with a clear plastic cover film/release liner 92 to which an inkjet-receptive coating 83 is then applied. An interface 93 is shown between the liner 92 and the coating 83.

Thus, the preferred method of making this embodiment of the prior invention is:
  a. Apply a tie-coat 32 to a backing sheet 31;
  b. Apply an adhesive coating 91 to at least a portion of the backing sheet 31 on the side opposite to the tie-coat 32;
  c. Cover the adhesive coating 91 with a clear plastic cover film/release liner 92; and
  d. Apply an inkjet-receptive coating 83 to the free surface of the plastic cover film/release liner 92.

Once this substrate has been prepared, a portion of it is trimmed to the desired size for preparing a flexography plate, and an island image 81 is printed on the inkjet-receptive coating 83 using, e.g., an inkjet printer.

A second method of making the I-Strate Plus™ substrate 90 is to apply the inkjet-receptive coating 83 to a plastic cover film/release liner 92, apply an adhesive coat 91 to one side of a backing sheet 31, and then apply the uncoated side of the plastic cover film/release liner 92 to the adhesive-coated side of the backing sheet 31.

Thus, a second method for making an I-Strate Plus™ substrate 90 is:
  a. Apply an inkjet-receptive coating 83 to a plastic cover film/release liner 92;
  b. Apply a tie-coat 32 to a backing sheet 31;
  c. Apply an adhesive coat 91 to one side of a backing sheet 31; and
  d. Apply the uncoated side of the plastic cover film/release liner 92 to the adhesive coat 91.

Once this substrate has been prepared, a portion of it is trimmed to the desired size for preparing a flexography plate and printed as described above.

A third method for making an I-Strate Plus™ substrate 90 is to print the island image on the cover film/release liner before the cover film/release liner is applied to the adhesive coat. This method requires the use of a cover film/release liner material that is dimensionally stable so that the image printed on it is not distorted during application to the adhesive coat. This method (not illustrated in the drawings) for making an I-Strate Plus™ substrate 90 with an island image 81 printed on it is:
  a. Apply the inkjet-receptive coating 83 to a plastic cover film/release liner 92;
  b. Print the island image 81 on the inkjet-receptive coating 83;
  c. Apply the tie-coat 32 to one side of the backing sheet 31;
  d. Apply the adhesive coat 91 to the opposing surface of the backing sheet 31; and
  e. Apply the unprinted surface of the cover film/release liner 92 to the adhesive coat 91.

It can be advantageous to apply the coating 91 so as not to completely cover the backing sheet 31. If the coating 91 is applied to the entire surface of the backing sheet opposite the tie-coat side, air bubbles can, and usually do, get trapped between the i-plate and the print roll when the I-plate is mounted on the roll. If the air bubbles are large enough, they can cause uneven printing because they cause variations in the height of the relief image above the surface of the roll. To prevent this, the technician placing the plate on the roll has to take extra time putting the plate on the roll to eliminate bubbles and/or popping the bubbles after the plate is affixed to the roll. However, if the coating 91 is applied in strips or other patterns, the size and number of air bubbles that may become trapped between the finished I-plate and the print roll is less and time is saved in fixing the plate to the print roll. Therefore, this invention includes in its scope covering less than the entire surface of the backing sheet with adhesive (but at least a portion of it, as claimed).

Figure 10:
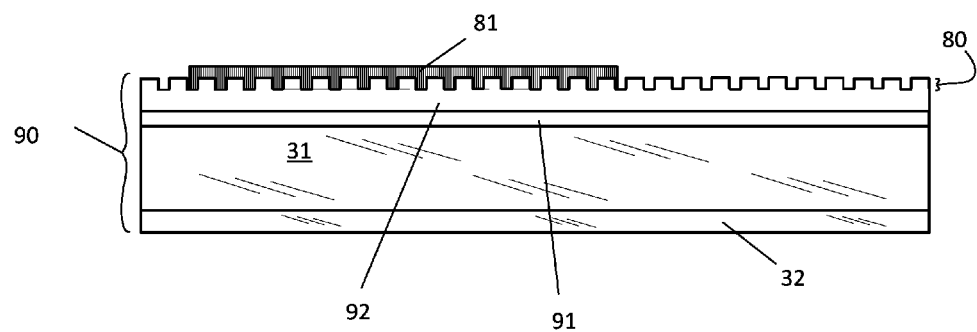
FIG. 10 is a cross-sectional view of another embodiment of the I-Strate Plus™ substrate for use with liquid photopolymer.

FIG. 10 is a cross-sectional view of a second embodiment of I-Strate Plus™ substrate 90, for use with liquid photopolymer, similar to the embodiment just described, with the difference being that the clear plastic cover film/release liner itself is inkjet-receptive. This is equivalent to removing the interface between the inkjet-receptive coating 83 (see FIG. 9) and the cover film/release liner 92, so that the cover film/release liner 92 has an inkjet receptive surface 80.

The methods of making this second embodiment of the prior invention differ from the above methods of making the preferred embodiment simply by removing the step of applying an inkjet-receptive coating.

Figure 11:
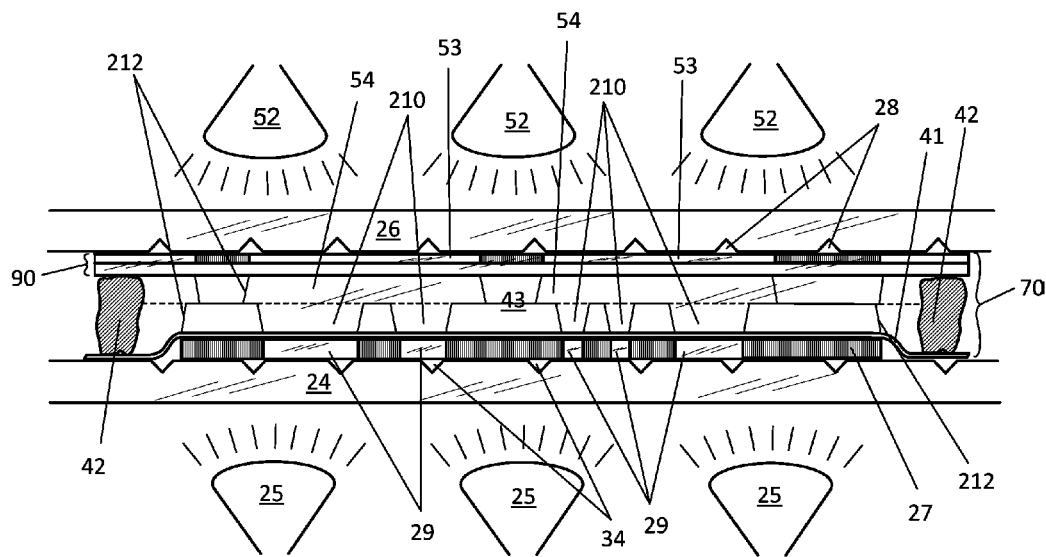
FIG. 11 is a cross-sectional illustration of the method for using an I-Strate Plus™ substrate for making a flexographic I-plate using a liquid photopolymer.

FIG. 11 is a cross-sectional illustration of the method for using an I-Strate Plus™ substrate 90 for making a flexographic I-plate using a liquid photopolymer. The necessary steps for preparing an I-plate from liquid photopolymer starting with an unprinted sheet of I-Strate Plus™ substrate 90 are as follows:
  a. Print the digital representation of the island image 81 on the inkjet-receptive side 83 of the I-Strate Plus™ substrate 90 (see FIG. 9) using a suitable inkjet printer;
  b. Place the relief image negative film 27 on the bottom glass 24 of the UV exposure unit;
  c. Place the lower surface of the liquid photopolymer layer 43 adjacent to the relief image negative film 27 (by pouring or casting the liquid photopolymer over the protected relief image negative film as is commonly practiced);
  d. Place the tie-coat 32 of the I-Strate Plus™ substrate 90 in contact with the upper surface of the liquid photopolymer layer 43 (registering the island image properly with respect to the relief image negative);
  e. Shine polymerizing light through the I-Strate Plus™ substrate 90 for an amount of time suitable to form polymerized island floor areas 54 of a desired thickness in the liquid photopolymer in contact with the tie-coat 32; and
  f. Shine polymerizing light through the relief image negative 27 for an amount of time suitable to form a polymerized relief image 210 in the liquid photopolymer between the polymerized island floor areas 54 and the relief image negative 27.

Figure 12:
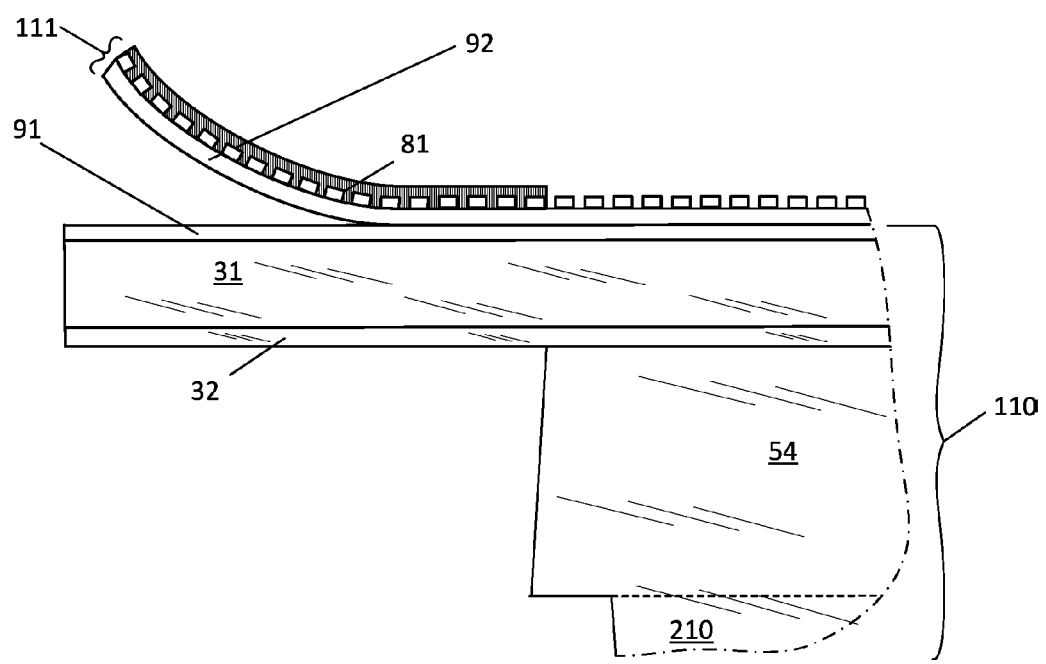
FIG. 12 is a cross-sectional illustration showing removal of the printed release liner from the finished I-Strate Plus™ flexographic printing plate.

FIG. 12 is a cross-sectional illustration showing the additional steps of removal of the exposed laminate of the preferred embodiment of the I-Strate Plus™ invention (see FIG. 9) from the exposure unit. After exposure is complete, the polymerized island and relief images 54 and 210 respectively are cleaned and cured and the printed cover film/release liner 111 is peeled off of the laminate, leaving the finished flexographic printing plate 110 with the adhesive layer 91 exposed.

The present invention, hereinafter called "Jetsetter Genesys™," supplements the above-described inventions by enabling flexographic plate-making negatives to be printed directly on the protective cover film as well as the adhesive release liner, hereinafter "image sheets," used in the plate making process. This means, in other words, printing directly on the cover film normally used to protect the relief image negative on the bottom glass of a UV exposure unit under the liquid photopolymer layer, as well as on the release cover film protecting the adhesive on the I-Strate Plus™ flexographic plate backing sheet. Doing this eliminates two separate negative layers and their interfaces by combining the relief image negative with the lower protective cover film and the island plate negative typically mounted above the backing sheet with the upper release liner.

Figure 13:
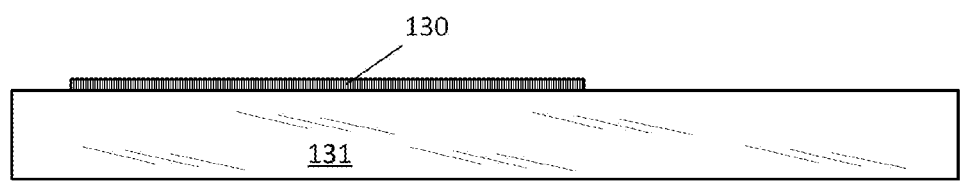
FIG. 13 is a cross-sectional illustration of a solvent ink negative printed on a protective cover film in accordance with the first embodiment of the present invention.

FIG. 13 is a cross-sectional illustration of a first embodiment of the present invention, namely a solvent ink negative image 130 printed on an image sheet 131 made entirely of solvent ink receptive material. The solvent inks made in accordance with U.S. patent application Ser. No. 13/902,301 are satisfactorily printed on cover film material comprising polyvinyl-based polymers, particularly polyvinylethylene. This embodiment may be used on the bottom glass of a UV exposure unit in place of a relief image negative covered by a protective cover film, with or without the Jetsetter Genesys™ substrate described further below. Using this embodiment, the entire relief image negative of the prior art is eliminated, along with the air-containing interface between the negative and the cover film of the prior art. The scope of this invention includes, by way of example and not limitation, mixtures or copolymers containing both polyvinyls and polyethylenes, which would be both solvent ink compatible and adhesive releasing, and polyvinyls and polyesters, which would be both solvent ink compatible and adhesive retaining.

Figure 14:
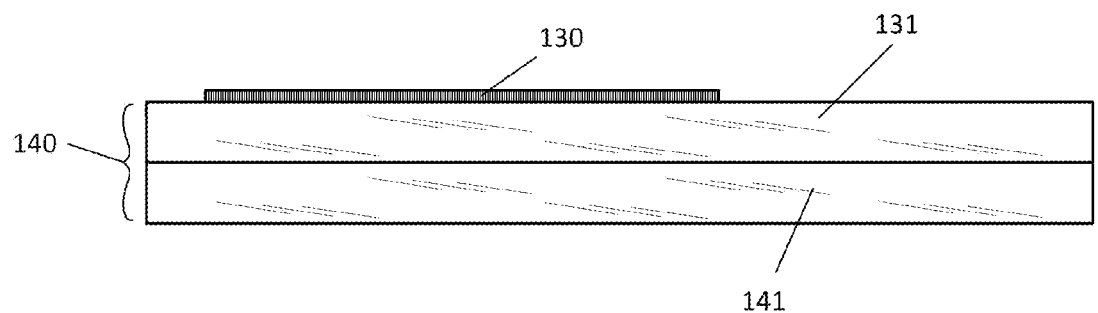
FIG. 14 is a cross-sectional illustration of a solvent ink negative printed on a protective cover film in accordance with the second embodiment of the present invention.

FIG. 14 is a cross-sectional illustration of a second embodiment image sheet of the present invention, namely a solvent ink negative image 130 printed on a protective cover film 140 made of a layer of solvent ink receptive material 131 superimposed on a layer of adhesive-releasing material 141. As in the first embodiment described in FIG. 13, the solvent inks made in accordance with U.S. patent application Ser. No. 13/902,301 are satisfactorily printed on cover sheet material comprising polyvinyl-based polymers, particularly polyvinylethylene. The layer of adhesive releasing material 141 may be comprised of a variety of polymer-based films such as polyethylene. The layer of adhesive releasing material 141 allows this embodiment to be used in place of the combination of a masking negative and release liner on top of the backing sheet. This cover film/release liner image sheet may be thicker than the cover film used in the first embodiment.

Alternatively, layer 141 may be a flexographic plate backing sheet such as polyester, with a tie-coat (not shown) applied to the bottom surface. This would allow a solvent ink image to be printed directly onto a backing sheet to be used in the manner of the backing sheet taught and claimed in the aforementioned I-Strate™ invention.

Figure 15:
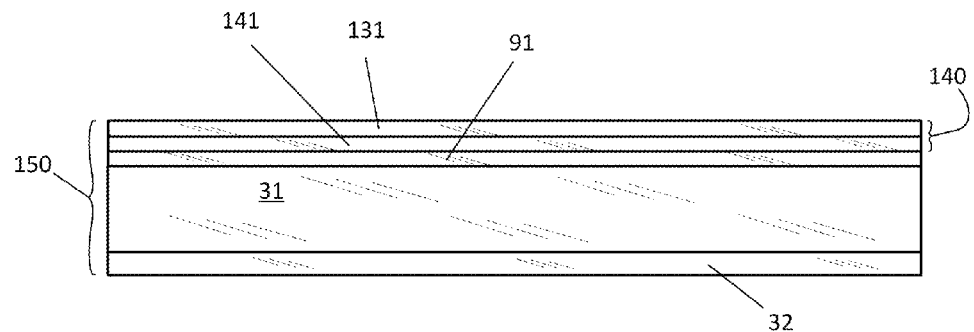
FIG. 15 is a cross-sectional illustration of the present invention, namely the Jetsetter Genesys™ substrate.

FIG. 15 is a cross-sectional illustration of a third embodiment of the present invention, namely the Jetsetter Genesys™ substrate 150 ready for solvent-based ink printing. The unprinted two-layer image sheet 140 of FIG. 14 has been placed against the adhesive coating 91 on a polyester backing sheet 31. A solvent-based image can now be printed on the solvent ink receptive layer 131.

Figure 16:
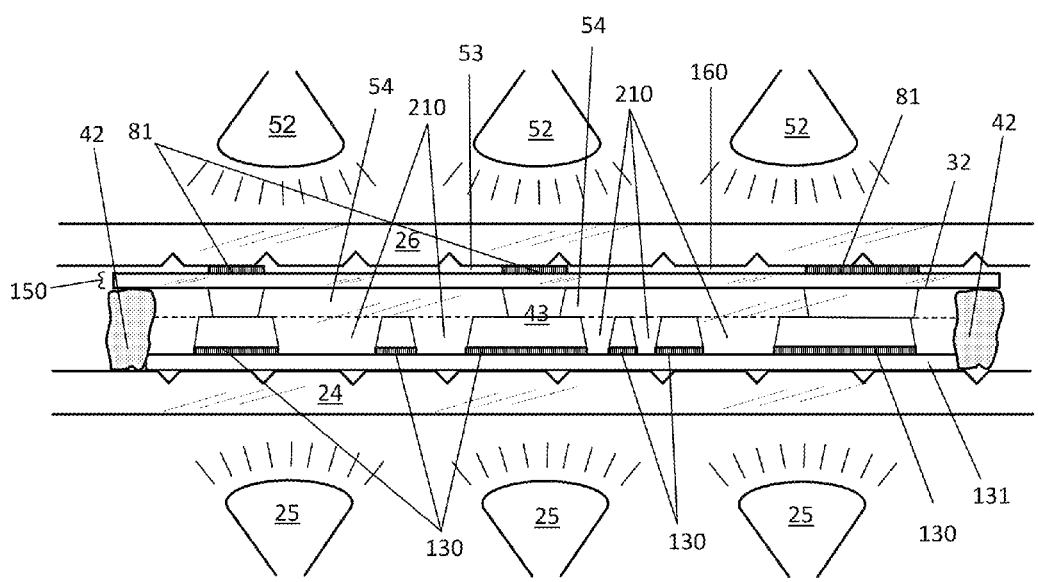
FIG. 16 is a cross-sectional illustration of the method for using the Jetsetter Genesys™ substrate for making a flexographic I-plate in accordance with the present invention.

FIG. 16 is a cross-sectional illustration of the method for using the Jetsetter Genesys™ substrate of the third embodiment together with a relief negative of the first embodiment in making a flexographic I-plate in accordance with the present invention. Steps for preparing an I-plate from liquid photopolymer starting with these two laminates are as follows:

a. Print the digital representation of the island image 81 on the inkjet-receptive side of the Jetsetter Genesys™ substrate 150 (see FIG. 15) using a suitable inkjet printer;

b. Print the digital representation of the relief image 130 onto the solvent ink receptive image sheet 131 using a suitable inkjet printer;

c. Place the image sheet 131 with the relief image 130 on the bottom glass 24 of the UV exposure unit (preferably, but not essentially, with the image side facing up);

d. Cast a layer of liquid photopolymer 43 adjacent to the relief image negative film 27 (employing dams 42 if necessary);

e. Place the tie-coat 32 of the Jetsetter Genesys™ substrate 150 in contact with the upper surface of the liquid photopolymer layer 43 (registering the island image properly with respect to the relief image negative);

f. Shine polymerizing light 52 through the Jetsetter Genesys™ substrate 150 for an amount of time suitable to form polymerized island floor areas 54 of a desired thickness in the liquid photopolymer in contact with the tie-coat 32; and g. Shine polymerizing light 25 through the relief image 130 for an amount of time suitable to form a polymerized relief image 210 in the liquid photopolymer between the polymerized island floor areas 54 and the relief image 130.

Image quality using these laminates is high because, especially with the relief ink image facing up as shown in FIG. 16, both ink-bearing films are in intimate contact with both the upper and lower surfaces of the photopolymer layer. The upper (Jetsetter Genesys™) laminate rests directly on the photopolymer layer, and the liquid photopolymer flows directly onto the image surface of the inked surface of the lower cover film. Because of this, it is not necessary to pull a vacuum on the upper or lower glasses of the UV exposure unit. (The space 160 in FIG. 16 is a drawing artifact due to the exaggerated vertical dimension of the drawing.)

Figure 17:
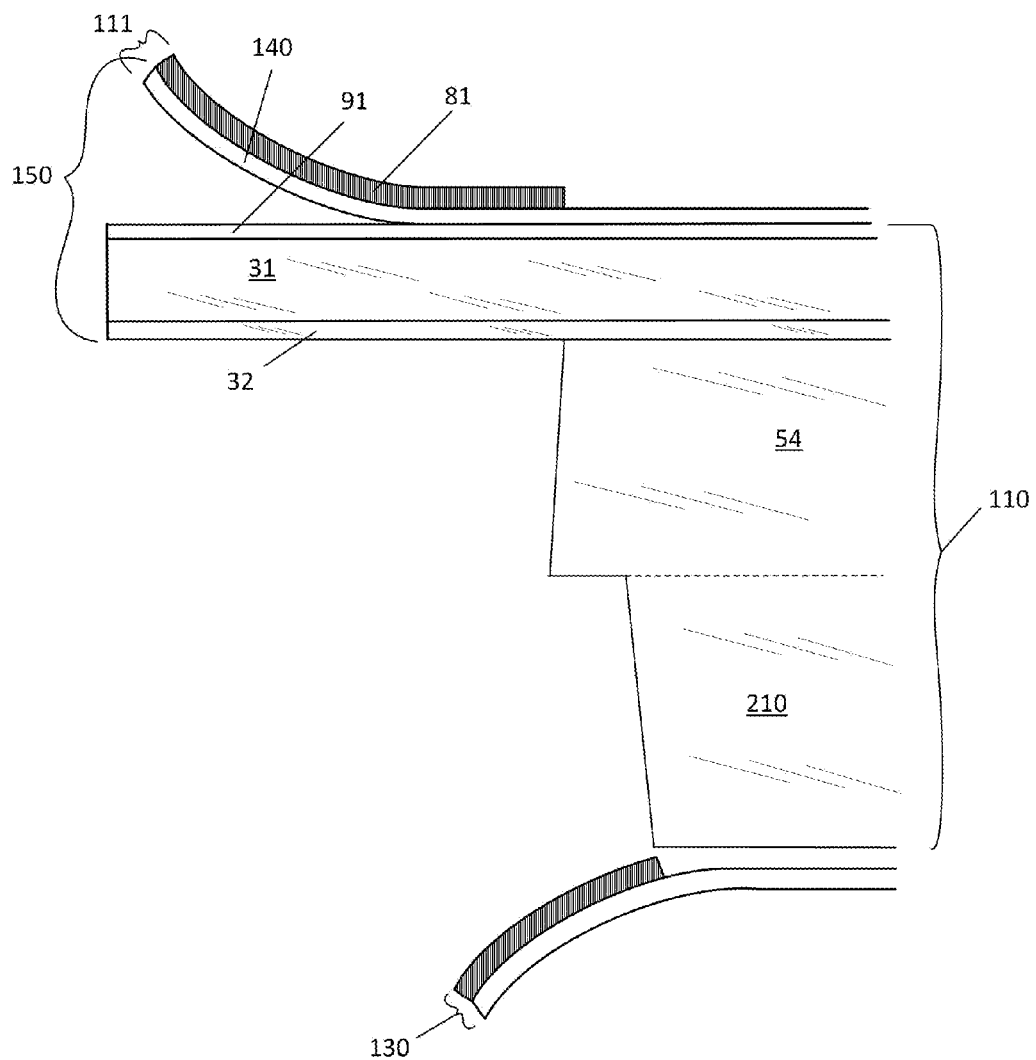
FIG. 17 is a cross-sectional illustration showing removal of the printed cover film and release liner from the finished Jetsetter Genesys™ flexographic printing plate made in accordance with the present invention.

FIG. 17 is a cross-sectional illustration showing removal of the printed cover film and release liner from the finished flexographic printing plate produced using Jetsetter Genesys™. After exposure is complete, the lower printed cover film 130 is peeled off of the relief image 210 and discarded. The upper printed release liner 111 is peeled off of the Jetsetter Genesys™ laminate 150 and discarded or reused. The polymerized island and relief images 54 and 210 respectively are cleaned and cured, leaving the finished flexographic printing plate 110 with the adhesive layer 91 exposed.

The invention claimed is:

1. A film, comprising:
   an image sheet of UV-transmissive plastic having a first surface and a second surface;
      the first surface being comprised of material receptive to solvent-based inks;
         the solvent-based inks being opaque to polymerizing radiation; and
      the second surface being comprised of polymer-based material.

2. The film of claim 1, in which:
   said material receptive to solvent-based inks comprises polyvinyl-based material.

3. The film of claim 2, in which:
   said polyvinyl-based material comprises polyvinylethylene.

4. The film of claim 1, comprising:
   a printed image on said first surface.

5. The film of claim 4, in which:
   said printed image is an inkjet image.

6. The film of claim 4, in which:
said printed image has an opacity of at least 3.0.

7. The film of claim 1, in which:
a tie-coat is applied to said second surface.

8. The film of claim 7, in which:
said material receptive to solvent-based inks comprises polyvinyl-based material.

9. The film of claim 8, in which:
said polyvinyl-based material comprises polyvinylethylene.

10. The film of claim 7, comprising:
a printed image on said first surface.

11. The film of claim 10, in which:
said printed image is an inkjet image.

12. The film of claim 10, in which:
said printed image has an opacity of at least 3.0.

13. A laminate, comprising:
an image sheet having a first surface and a second surface;
   the first surface being compatible with solvent-based inks;
   the second surface being polymer-based material;
a backing sheet having a third surface and a fourth surface;
   the third surface being applied to a photopolymer layer;
   the fourth surface having an adhesive coating;
   the second surface of the image sheet being applied to the adhesive coating; and
   the fourth surface of the backing sheet adhering more strongly to the adhesive coating than the second surface.

14. The laminate of claim 13, in which:
said polymer-based material comprises polyvinyl-based material.

15. The laminate of claim 14, in which:
said polyvinyl-based material comprises polyvinylethylene.

16. The laminate of claim 13, comprising:
a printed image on said first surface.

17. The laminate of claim 16, in which:
said printed image is an inkjet image.

18. The laminate of claim 17, in which:
said inkjet image prevents UV radiation in the applicable wavelength range from penetrating said printed image to cause unwanted polymerization.

19. A film, comprising:
a release liner having a polymer-based surface on one side;
an ink-receptive surface on the other side; and
an inkjet-printed image on the ink-receptive surface.

20. A laminate, comprising:
a backing sheet comprising a photopolymer layer on one side of the backing sheet for producing a crosslinked flexographic relief;
an adhesive coating on the other side of the backing sheet; and
a release liner having one side of the release liner placed against the adhesive coating and the other side of the release liner comprising an ink-receptive surface.

21. The laminate of claim 20, wherein:
an image is printed on said ink-receptive surface with ink that prevents UV radiation from penetrating the image to cause unwanted polymerization.

* * * * *